(12) United States Patent
Lee et al.

(10) Patent No.: US 8,785,954 B2
(45) Date of Patent: Jul. 22, 2014

(54) ORGANIC LIGHT-EMITTING DEVICE (75) Inventors: Joon-Gu Lee, Yongin (KR); Won-Jong Kim, Yongin (KR); Ji-Young Choung, Yongin (KR); Jin-Baek Choi, Yongin (KR); Yeon-Hwa Lee, Yongin (KR); Young-Woo Song, Yongin (KR); Jong-Hyuk Lee, Yongin (KR)

(73) Assignee: Samsusng Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/437,246

(22) Filed: Apr. 2, 2012

(65) Prior Publication Data
US 2012/0286318 A1 Nov. 15, 2012

(30) Foreign Application Priority Data
May 11, 2011 (KR) .......................... 10-2011-0044048

(51) Int. Cl.
*H01L 51/54* (2006.01)
*H01L 33/00* (2010.01)

(52) U.S. Cl.
USPC ........ 257/98; 257/40; 257/E51.018; 313/504; 313/506

(58) Field of Classification Search
USPC ................ 257/40, E51.018, E51.019, 98, 99; 313/504, 506, 512
See application file for complete search history.

(56) References Cited

U.S. PATENT DOCUMENTS

| 7,321,196 | B2 * | 1/2008 | Cheng et al. | 313/504 |
| 2006/0250079 | A1 * | 11/2006 | Kwok et al. | 313/506 |
| 2008/0258612 | A1 * | 10/2008 | Kim et al. | 313/504 |

FOREIGN PATENT DOCUMENTS

| KR | 10-0232171 B1 | 9/1999 |
| KR | 10-2004-0065667 A | 7/2004 |
| KR | 10-2010-0068939 A | 6/2010 |

* cited by examiner

*Primary Examiner* — Matthew W Such
*Assistant Examiner* — Scott Stowe
(74) *Attorney, Agent, or Firm* — Lee & Morse, P.C.

(57) ABSTRACT

An organic light-emitting device includes a substrate, an anode including Ag on the substrate, a transparent inorganic thin-film layer on the anode, the transparent inorganic thin-film layer being in contact with the anode and having nonconductive characteristics; and an emitting layer and a cathode disposed sequentially on the inorganic thin-film layer.

14 Claims, 8 Drawing Sheets

ORGANIC LIGHT-EMITTING DEVICE

This application claims priority from Korean Patent Application No. 10-2011-0044048 filed on May 11, 2011 in the Korean Intellectual Property Office, the disclosure of which is incorporated herein by reference in its entirety.

BACKGROUND

1. Field of the Invention

Embodiments relate to an organic light-emitting device.

2. Description of the Related Art

An organic light-emitting device is a self-emitting display device including an anode, a cathode, and an organic film inserted between the anode and the cathode. When a current is supplied to the organic light-emitting device, the organic light-emitting device emits light by the combination of electrons and holes in the organic film. Accordingly, organic light-emitting devices make it possible to realize a lightweight, thin display device having high image quality, fast response time, and wide viewing angle characteristics. Currently, organic light-emitting devices are used not just in mobile phones, but in a wide range of applications including various high-definition information display devices.

SUMMARY OF THE INVENTION

According to one or more embodiments, an organic light-emitting device may include a substrate, an anode including Ag on the substrate, a transparent inorganic thin-film layer on the anode, the transparent inorganic thin-film layer being in contact with the anode and having non-conductive characteristics, and an emitting layer and a cathode disposed sequentially on the inorganic thin-film layer. The inorganic thin-film layer may have dipole characteristics. The inorganic thin-film layer may include $Yb_2O_3$. The inorganic thin-film layer may have an extinction coefficient value of 0.001 or less for light of wavelengths of 420 to 480 nm. The inorganic thin-film layer may include an In-containing oxide. The In-containing oxide may be InAsOx or InPOx.

The anode may be thicker than the inorganic thin-film layer. The inorganic thin-film layer may have a thickness of 10 to 200 Å.

The organic light-emitting device may further include a hole injecting layer, a hole transporting layer, and an electron transporting layer, wherein the hole injecting layer and the hole transporting layer are disposed sequentially on the inorganic thin-film layer, the emitting layer is disposed on the hole transporting layer, and the electron transporting layer and the cathode are disposed sequentially on the emitting layer. A contact surface of the inorganic thin-film layer in contact with the hole injecting layer may be uneven.

According to one or more embodiments, an organic light-emitting device may include a substrate, an anode including Ag on the substrate, a thin-film layer on the anode, the thin-film layer in contact with the anode, and an emitting layer and a cathode disposed sequentially on the thin-film layer, wherein the thin-film layer has an extinction coefficient value of 0.001 or less for light of wavelengths of 420 to 480 nm. The thin-film layer may include a transparent inorganic material having non-conductive characteristics. The thin-film layer may include at least one of $Yb_2O_3$, InAsOx, and InPOx. The thin-film layer may have dipole characteristics. The thin-film layer may have a thickness of 10 to 200 Å.

The organic light-emitting device may further include a hole injecting layer, a hole transporting layer, and an electron transporting layer, wherein the hole injecting layer and the hole transporting layer are disposed sequentially on the thin-film layer, the emitting layer is disposed on the hole transporting layer, and the electron transporting layer and the cathode are disposed sequentially on the emitting layer. A contact surface of the inorganic thin-film layer in contact with the hole injecting layer may be uneven.

BRIEF DESCRIPTION OF THE DRAWINGS

The above and other aspects and features of the embodiments will become more apparent by describing in detail exemplary embodiments thereof with reference to the attached drawings, in which.

DETAILED DESCRIPTION OF THE INVENTION

Embodiments will now be described more fully hereinafter with reference to the accompanying drawings, in which preferred embodiments are shown. Embodiments may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, an organic light-emitting device according to an exemplary embodiment will be described with reference to FIGS. 1 through 3.

Figure 1:
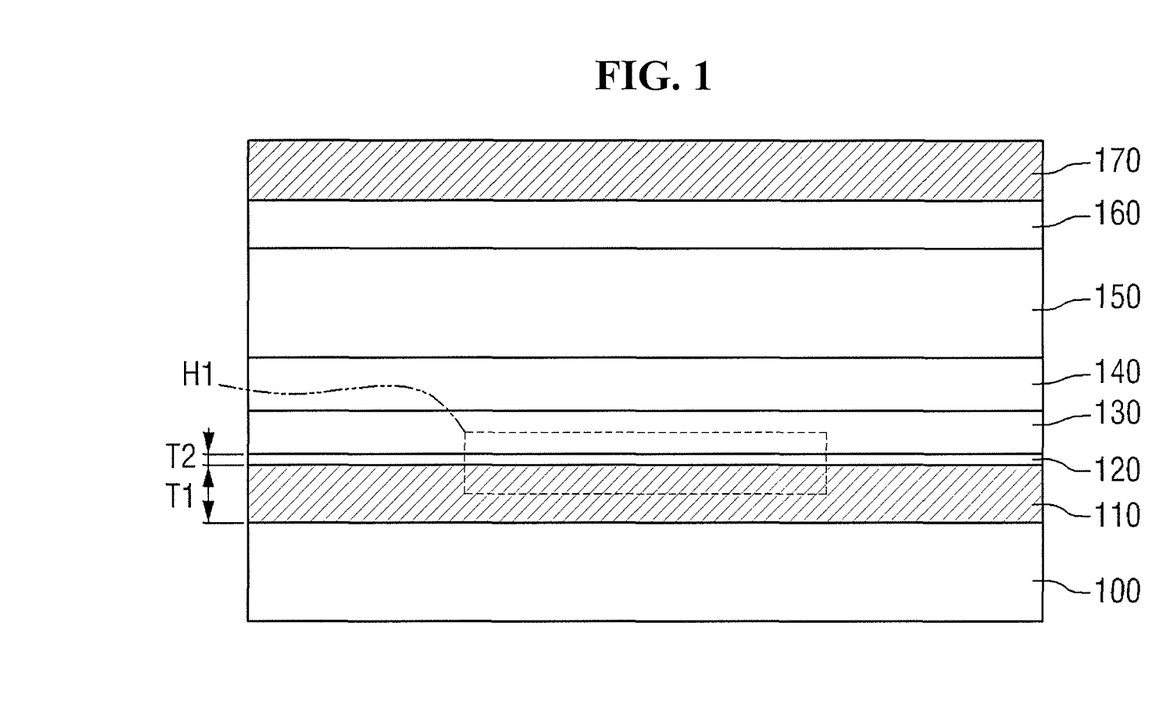
FIG. 1 illustrates a cross-sectional view of an organic light-emitting device according to an exemplary embodiment.

FIG. 1 illustrates a cross-sectional view of an organic light-emitting device according to an exemplary embodiment. FIGS. 2 and 3 illustrate graphs showing the extinction coefficients of materials, which form thin-film layers of organic light-emitting devices, according to some exemplary embodiments, with respect to optical wavelength.

Referring to FIG. 1, the organic light-emitting device according to the current exemplary embodiment includes a substrate 100, an anode 110, a thin-film layer 120, an emitting layer 150, and a cathode 170.

The anode 110 may be disposed on the substrate 100. The anode 110 may contain Ag to increase its reflectance. That is, the anode 110 may be made of Ag.

The thin-film layer 120 may be disposed on the anode 110. Specifically, the thin-film layer 120 may be disposed directly on the anode 110, and may be in contact with the anode 110.

In an implementation, the thin-film layer 120 may be a thin film made of a transparent inorganic material having non-conductive characteristics.

The thin-film layer 120 may include a transparent material that allows light incident from the emitting layer 150 and light reflected by the anode 110 to pass therethrough. The thin-film layer 120 may not conduct electricity even when a potential difference is created at both ends thereof. That is, the thin-film layer 120 may have non-conductive characteristics, i.e., insulating characteristics. In addition, the thin-film layer 120 may be an inorganic thin film made of an inorganic material.

A representative example of a suitable material that may be used to form the thin-film layer 120, which has the above characteristics, is $Yb_2O_3$. Other examples of suitable materials include LiF and $MgF_2$. However, embodiments are not limited to the above materials. Any suitable material can be used to form the thin-film layer 120 according to the current exemplary embodiment as long as the material exhibits all of the above-described characteristics.

According to the current exemplary embodiment, light efficiency may be improved in the organic light-emitting device including the thin-film layer 120 made of a transparent inorganic material having non-conductive characteristics.

Specifically, when the thin-film layer 120 disposed on the anode 110 has a high light-absorption rate, the anode 110 may have relatively low reflectance. The low reflectance of the anode 110 may increase the amount of light lost during resonance, thereby reducing the efficiency of the organic light-emitting device.

In particular, when the thin-film layer 120 has a high absorption rate at optical wavelengths (approximately 420 to 480 nm) in a blue visible light region, the light efficiency of the organic light-emitting device may significantly deteriorate. Therefore, to increase the light efficiency of the organic light-emitting device, the reflectance of an electrode (e.g., the anode 110) may be increased by reducing the absorption rate of the thin-film layer 120 at the optical wavelengths (approximately 420 to 480 nm) in the blue visible light region.

When the thin-film layer 120 is made of a transparent inorganic material (such as $Yb_2O_3$, LiF, or $MgF_2$) having non-conductive characteristics, and is positioned to directly contact a top surface of the anode 110 of the organic light-emitting device, its absorption rate at the optical wavelengths (approximately 420 to 480 nm) in the blue visible light region may be reduced. Thus, the reflectance of an electrode (e.g., the anode 110) may be increased. This will be described in greater detail with reference to experimental examples.

The thin-film layer 120 of the organic light-emitting device, according to some exemplary embodiments, may have dipole characteristics. For example, the arrangement of molecules of the thin-film layer 120 may be changed by an electric field or a magnetic field. Accordingly, when the same voltage is applied to the thin-film layer 120 and a thin-film layer having conductive characteristics, the current density per unit area of the organic light-emitting device including the thin-film layer 120 may not be lower than that of an organic light-emitting device including the thin-film layer having the conductive characteristics. Therefore, the organic light-emitting device including the thin-film layer 120 may maintain the same injection characteristics as the organic light-emitting device including the thin-film layer having the conductive characteristics. The injection characteristics of the organic light-emitting device including the thin-film layer 120 having the dipole characteristics will be described in greater detail later with reference to the experimental examples.

$Yb_2O_3$ may be used to form the thin-film layer 120, since $Yb_2O_3$ has the characteristics described above. Also, LiF or $MgF_2$ may be used to form the thin-film layer 120, since LiF or $MgF_2$ have the characteristics described above.

The thin-film layer 120 of the organic light-emitting device, according to some other embodiments, may have an extinction coefficient value of 0.001 or less at the optical wavelengths (approximately 420 to 480 nm) in the blue visible light region. Accordingly, the light efficiency of the organic light-emitting device may be improved.

Specifically, as described above, the thin-film layer 120, which has an extinction coefficient value of 0.001 or less at the optical wavelengths (approximately 420 to 480 nm) in the blue visible light region, may have a low absorption rate of light in the blue visible light region. The low absorption rate may increase the reflectance of an electrode (e.g., the anode 110), thereby improving the light efficiency of the organic light-emitting device.

An example of a suitable material for forming the thin-film layer 120 may be an In-containing oxide. More specifically, a suitable material for forming the thin-film layer 120 may be, for example, $InAsO_x$ or $InPO_x$.

Figure 2:
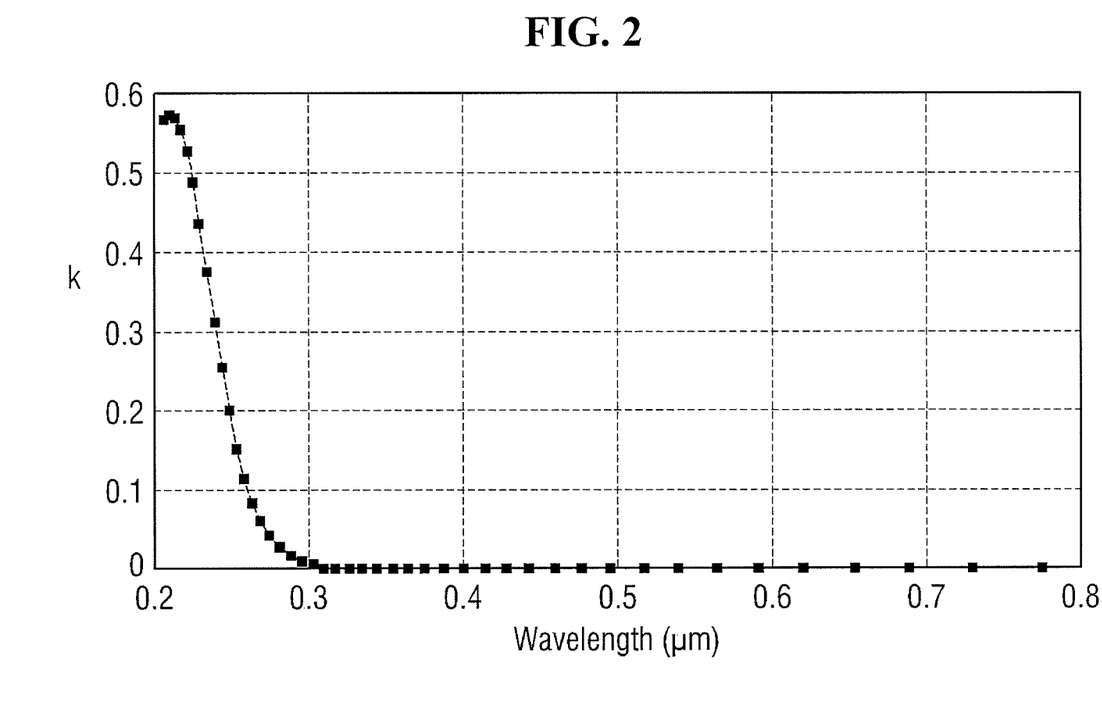
FIGS. 2 and 3 illustrate graphs of the extinction coefficients of materials, which form thin-film layers of organic light-emitting devices according to some exemplary embodiments, with respect to optical wavelength.
Figure 3:
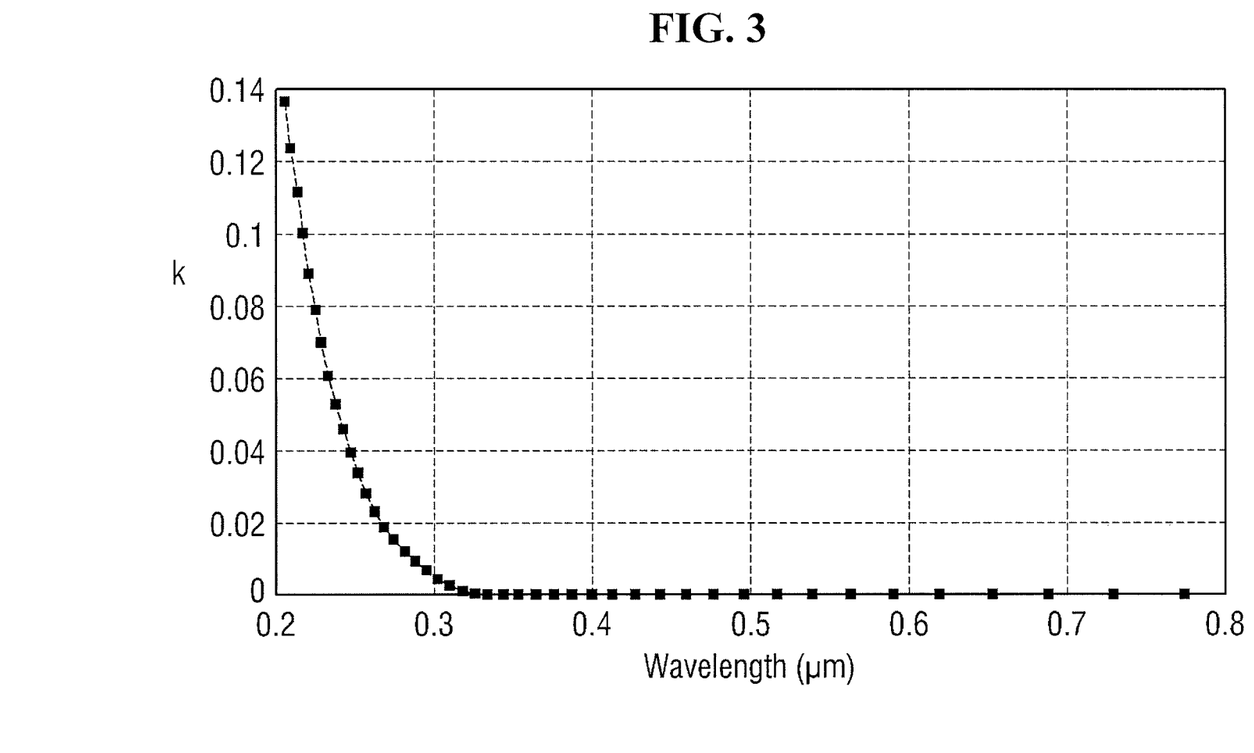

In FIGS. 2 and 3, extinction coefficient values k of $InAsO_x$ and $InPO_x$ are illustrated. Referring to FIGS. 2 and 3, $InAsO_x$ and $InPO_x$ have an extinction coefficient value of 0.001 or less at optical wavelengths of approximately 420 to 480 nm. Therefore, an In-containing oxide, such as $InAsO_x$ or $InPO_x$, may be used to form the thin-film layer 120.

Further, LiF has an extinction coefficient of $2.6 \times 10^{-8}$ at an optical wavelength of 450 nm. Therefore, LiF may also be used to form the thin-film layer 120.

A thickness T2 of the anode 110 of the organic light-emitting device according to some other embodiments may be greater than a thickness T2 of the thin-film layer 120. Here, the thickness T2 of the thin-film layer 120 may be about 10 to about 200 Å.

The thin-film layer 120 having a thickness of 200 Å or less (e.g., to about 10 Å) may not adversely affect the injection characteristics of the organic light-emitting device and may enable the organic light-emitting device to maintain optimal injection characteristics.

The thin-film layer 120 having a thickness of 10 Å or more (e.g., up to about 200 Å) may not affect the thin-film stability and reflection characteristics of an electrode (e.g., the anode 110). Thus, the thin-film layer 120 may ensure the thin-film stability of the electrode and enable the electrode to maintain optimal reflection characteristics.

Referring back to FIG. 1, the emitting layer 150, which emits light, and the cathode 170 may be disposed sequentially on the thin-film layer 120.

In some embodiments, a hole injecting layer 130, which facilitates injection of holes and a hole transporting layer 140, which facilitates the transportation of holes from the anode 110 toward the emitting layer 150, may be disposed between the thin-film layer 120 and the emitting layer 150. In addition, an electron transporting layer 160, which facilitates the transportation of electrons from the cathode 170 toward the emitting layer 150, may be disposed between the cathode 170 and the emitting layer 150.

The hole injecting layer 130 and the hole transporting layer 140 may be sequentially disposed on the thin-film layer 120, and the electron transporting layer 160 may be disposed on the emitting layer 150. The hole injecting layer 130, the hole transporting layer 140, and the electron transporting layer 160 may be responsible for the injection and transportation of holes and electrons. Although not shown in the drawings, the hole injecting layer 130, the hole transporting layer 140, and the electron transporting layer 160, may be omitted as desired or may have a multilayer thin-film structure.

Hereinafter, an organic light-emitting device according to another exemplary embodiment will be described with reference to FIGS. 4, 5A and 5B.

Figure 4:
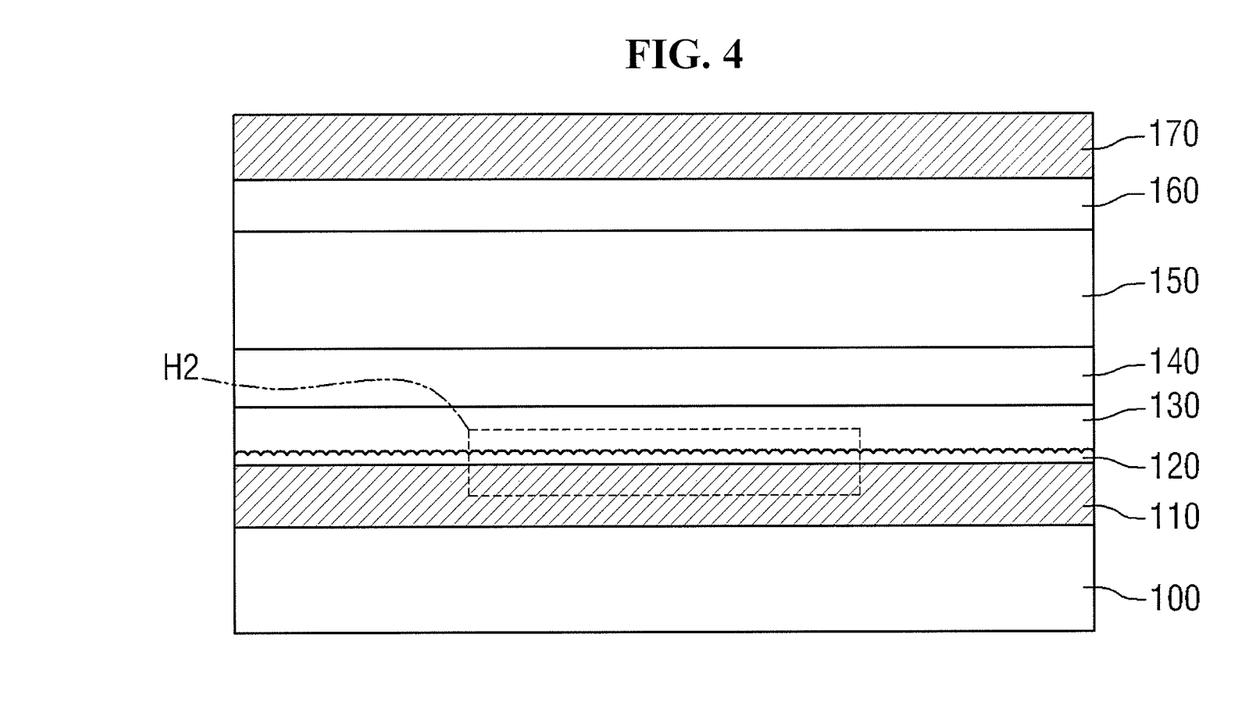
FIG. 4 illustrates a cross-sectional view of an organic light-emitting device according to another exemplary embodiment.

FIG. 4 illustrates a cross-sectional view of an organic light-emitting device according to another exemplary embodiment. FIG. 5A illustrates an enlarged cross-sectional view of a region H1 shown in FIG. 1. FIG. 5B illustrates an enlarged cross-sectional view of a region H2 shown in FIG. 4. For simplicity, a description of elements and features substantially identical to those of the previous embodiment described above with reference to FIG. 1 will be omitted, and differences between the current and previous embodiments will mainly be described.

Referring to FIG. 4, a contact surface of a thin-film layer 120 of the organic light-emitting device that is in contact with a hole injecting layer 130 may be uneven. According to some embodiments, the contact surface of the hole injecting layer 130 and the thin-film layer 120, i.e., surfaces of the hole injecting layer 130 and the thin-film layer 120 that contact one another, may be uneven surfaces, i.e., surfaces that are not planar or level. In other words, an interface between the hole injecting layer 130 and the thin-film layer 120 may be uneven. The uneven contact surface may further improve the reflectance of an electrode (e.g., an anode 110), thereby further improving the light efficiency of the organic light-emitting device.

Figure 5A:
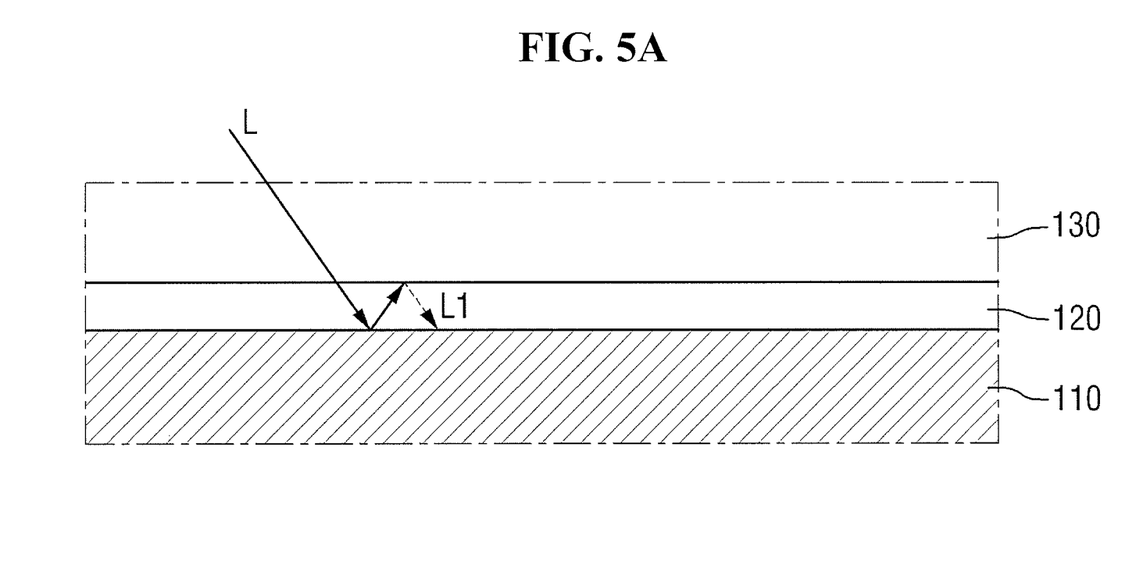
FIG. 5A illustrates an enlarged cross-sectional view of a region H1 shown in FIG. 1.

More specifically, FIG. 5A illustrates an optical path of reflected light L1 of incident light L in a case where the contact surface of the hole injecting layer 130 and the thin-film layer 120 is planar. FIG. 5B illustrates an optical path of reflected light L2 of incident light L in a case where the contact surface of the hole injecting layer 130 and the thin-film layer 120 is uneven.

Referring to FIG. 5A, when the contact surface of the hole injecting layer 130 and the thin-film layer 120 is planar, totally reflected light (indicated by a dotted line) may be generated at an interface between the hole injecting layer 130 and the thin-film layer 120, due to the density difference between them.

Figure 5B:
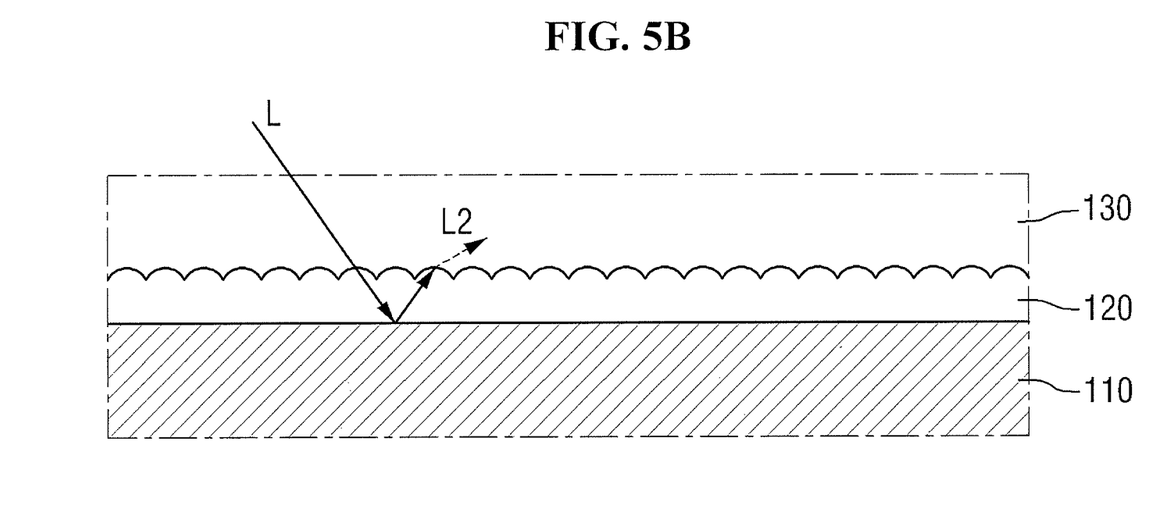
FIG. 5B illustrates an enlarged cross-sectional view of a region H2 shown in FIG. 4.

Referring to FIG. 5B, when the contact surface of the hole injecting layer 130 and the thin-film layer 120 is uneven, an angle of incidence and an angle of reflection are changed at the interface between the hole injecting layer 130 and the thin-film layer 120. Thus, the totally reflected light (indicated by the dotted line in FIG. 5A) is not reflected at the interface but enters the hole injecting layer 130 as indicated by a dotted line in FIG. 5B. Accordingly, the uneven contact surface of the hole injecting layer 130 and the thin-film layer may further improve the reflectance of an electrode (e.g., the anode 110), thereby further improving the light efficiency of the organic light-emitting device.

Figure 6:
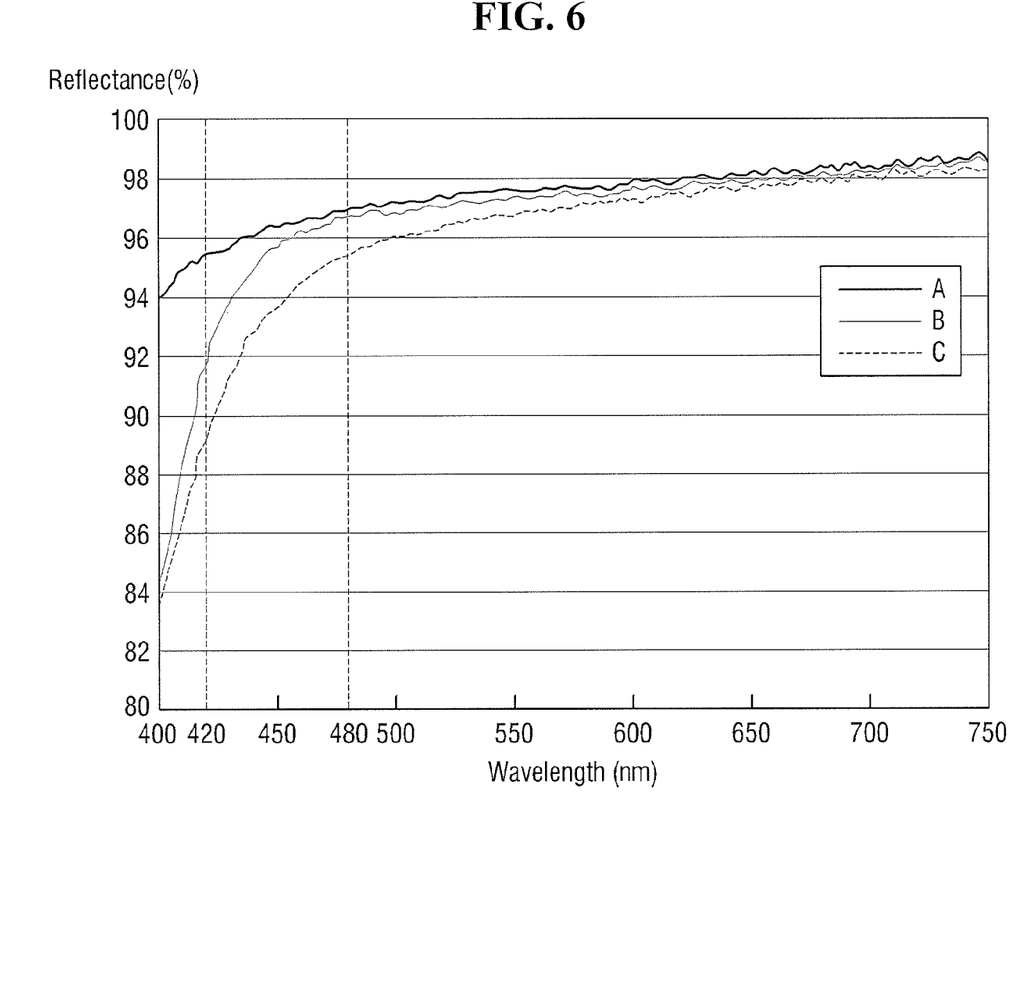
FIGS. 6 and 7 illustrate diagrams showing characteristics of an organic light-emitting device according to exemplary embodiments.
Figure 7:
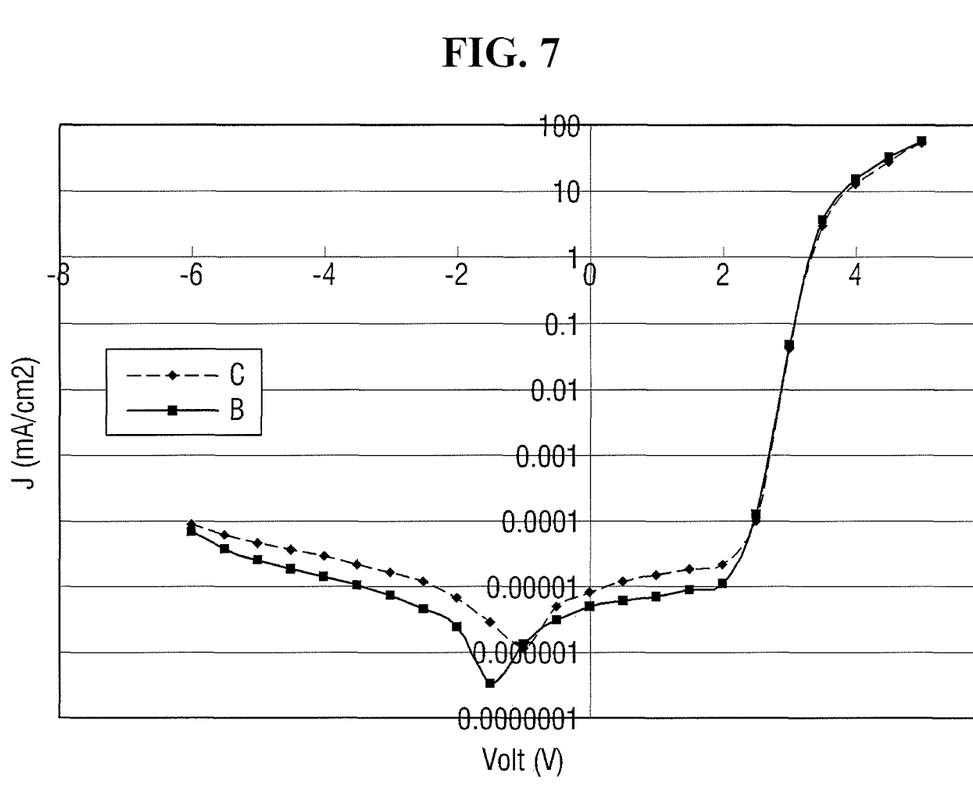

Hereinafter, experimental examples will be described with reference to FIGS. 6 and 7, and characteristics of an organic light-emitting device according to exemplary embodiments will be described based on the experimental examples. FIGS. 6 and 7 are diagrams illustrating characteristics of an organic light-emitting device according to exemplary embodiments.

Experimental Example

A thin film of $Yb_2O_3$ was formed with a thickness of 70 Å on an anode made of Ag with a thickness of 1000 Å, and the resultant structure was used in an experimental group in a light reflectance experiment. In addition, a thin film of ITO was formed with a thickness of 70 Å on an anode made of Ag with a thickness of 1000 Å, and the resultant structure was used in a control group. The experimental group and the control group were compared with an anode which was made of Ag with a thickness of 1000 Å and on which no thin-film layer was formed.

The results of the reflectance experiment are illustrated in FIG. 6. Referring to FIG. 6, reflectance is highest across the entire wavelength region when no thin-film layer is formed on an anode (see 'A' in FIG. 6). However, thin-film stability may not be secured only with the anode made of Ag. As such, a thin-film layer may be required as described above.

When $Yb_2O_3$ used to form a thin-film layer (see 'B' in FIG. 6) the reflectance characteristics across the entire wavelength region were higher than ITO (see 'C' in FIG. 6). In particular, the thin film of the experimental group had a lower absorption rate than that of the control group at wavelengths (approximately 420 to 480 nm) in a blue visible light region. Thus, the thin film of the experimental group increased reflectance of an electrode.

To see if the increased reflectance leads to improved light efficiency of an organic light-emitting device, an experiment was conducted on the light efficiency of the organic light-emitting device.

The results of the experiment on the light efficiency of the organic light-emitting device are shown in Table 1 below.

TABLE 1

| Structure | Converted Efficiency | Improvement in Light Efficiency |
|---|---|---|
| C | 76.8 | — |
|   | 79.7 | — |
| B | 85.6 | 109.4% |
|   | 89.2 | 114.0% |
|   | 90.7 | 115.9% |
|   | 90.1 | 115.3% |

In Table 1, the converted efficiency denotes the efficiency of an organic light-emitting device in view of color coordinate deviations. As shown in Table 1, the efficiency of an organic light-emitting device ('B' in Table 1) including the thin-film layer, according to exemplary embodiments, is greater than that of an organic light-emitting device ('C' in Table 1) including the ITO thin-film layer, by approximately 10 to 15%.

Lastly, in order to identify injection characteristics, the current density per unit area of the organic light-emitting device including the thin-film layer, according to exemplary embodiments and that of the organic light-emitting device including the ITO thin-film layer were measured with respect to voltage. The results are shown in FIG. 7.

Referring to FIG. 7, the organic light-emitting device (see 'B' in FIG. 7) including the thin-film layer, according to the exemplary embodiments is not greatly different from the organic light-emitting device (see 'C' in FIG. 7) including the ITO thin-film layer, in terms of current density per unit area. In addition, they have substantially the same current density value per unit area at a voltage of approximately 2 V or higher. Therefore, it can be understood that the organic light-emitting device (see 'B' in FIG. 7) including the thin-film layer, according to the exemplary embodiments, is not inferior in injection characteristics to the organic light-emitting device (see 'C' in FIG. 7) including the ITO thin-film layer.

In an organic light-emitting device according to exemplary embodiments, the light reflectance of an electrode may be improved, and the improved light reflectance may have the effect of significantly improving the light efficiency of the entire organic light-emitting device. In particular, a thin-film layer included in the organic light-emitting device, according to the exemplary embodiments, may have a low absorption rate at optical wavelengths (approximately 420 to 480 nm) in a blue visible light region, thus improving the light reflectance of the electrode and the light efficiency of the organic light-emitting device.

The light efficiency of an organic light-emitting device may improve as the reflectance of an electrode having a reflection function increases. Embodiments provide an anode including a single film of Ag having high reflectance. The thin-film layer may increase the thin-film stability of the organic light-emitting device while improving light efficiency, due to its low light absorption rate. Embodiments provide an organic light-emitting device with improved light efficiency.

In addition, the thin-film layer of the organic light-emitting device may have dipole characteristics. Therefore, the thin-film layer may maintain the same injection characteristics as a thin-film layer having conductive characteristics.

What is claimed is:

1. An organic light-emitting device, comprising:
   a substrate;
   an anode including Ag directly on the substrate;
   an inorganic thin-film layer directly on the anode; and
   an emitting layer and a cathode disposed sequentially on the inorganic thin-film layer,
   wherein the inorganic thin-film layer includes at least one of LiF, $MgF_2$, $Yb_2O_3$, $InAsO_x$, and $InPO_x$.

2. The organic light-emitting device of claim 1, wherein the thin-film layer has dipole characteristics.

3. The organic light-emitting device of claim 1, wherein the thin-film layer includes a transparent inorganic material having non-conductive characteristics.

4. The organic light-emitting device of claim 1, wherein the thin-film layer has an extinction coefficient value of 0.001 or less for light of wavelengths of 420 to 480 nm.

5. The organic light-emitting device of claim 4, wherein the thin-film layer includes an In-containing oxide.

6. The organic light-emitting device of claim 1, wherein the anode is thicker than the thin-film layer.

7. The organic light-emitting device of claim 6, wherein the thin-film layer has a thickness of 10 to 200 Å.

8. An organic light-emitting device, comprising:
   a substrate;
   an anode including Ag on the substrate;
   a thin-film layer on the anode, the thin-film layer in contact with the anode; and
   an emitting layer and a cathode disposed sequentially on the thin-film layer,
   wherein the thin-film layer has an extinction coefficient value of 0.001 or less for light of wavelengths of 420 to 480 nm and the thin-film layer includes InAsOx or InPOx.

9. The organic light-emitting device of claim 8, wherein the thin-film layer has dipole characteristics.

10. The organic light-emitting device of claim 8, wherein the thin-film layer has a thickness of 10 to 200 Å.

11. The organic light-emitting device of claim 8, further comprising a hole injecting layer, a hole transporting layer, and an electron transporting layer, wherein the hole injecting layer and the hole transporting layer are disposed sequentially on the thin-film layer, the emitting layer is disposed on the hole transporting layer, and the electron transporting layer and the cathode are disposed sequentially on the emitting layer.

12. The organic light-emitting device of claim 11, wherein a contact surface of the thin-film layer in contact with the hole injecting layer is uneven.

13. An organic light-emitting device, comprising:
    a substrate;
    an anode including Ag on the substrate;
    a thin-film layer on the anode, the thin-film layer being in contact with the anode;
    an emitting layer and a cathode disposed sequentially on the thin-film layer;
    a hole injecting layer;
    a hole transporting layer; and
    an electron transporting layer, wherein the hole injecting layer and the hole transporting layer are disposed sequentially on the thin-film layer, the emitting layer is disposed on the hole transporting layer, and the electron transporting layer and the cathode are disposed sequentially on the emitting layer, wherein a contact surface of the thin-film layer in contact with the hole injecting layer is uneven.

14. The organic light-emitting device of claim 13, wherein the thin-film layer includes at least one of LiF, $MgF_2$, $Yb_2O_3$, InAsOx, and InPOx.

* * * * *